United States Patent [19]
Voegeli

[11] 4,001,794
[45] Jan. 4, 1977

[54] METHOD AND APPARATUS FOR CONTROLLED GENERATION OF WALL TOPOLOGY IN MAGNETIC DOMAINS

[75] Inventor: Otto Voegeli, San Jose, Calif.

[73] Assignee: International Business Machines Corporation, Armonk, N.Y.

[22] Filed: Apr. 21, 1975

[21] Appl. No.: 570,146

[52] U.S. Cl. .................................. 340/174 TF
[51] Int. Cl.$^2$ .................................. G11C 11/14
[58] Field of Search .......................... 340/174 TF

[56] References Cited

UNITED STATES PATENTS

| | | | |
|---|---|---|---|
| 3,706,081 | 12/1972 | Bobeck et al. | 340/174 TF |
| 3,890,605 | 6/1975 | Sionczewski | 340/174 TF |

OTHER PUBLICATIONS

IBM Technical Disclosure Bulletin, Vol. 17, No. 5, Oct. 1974 p. 1485.

*Primary Examiner*—James W. Moffitt
*Attorney, Agent, or Firm*—Joseph E. Kieninger

[57] ABSTRACT

Magnetic domains with defined wall topologies are controllably generated from a domain having known characteristics. A "mother" bubble domain of a known wall state is generated by nucleation. The mother domain is stretched and split in the presence of a magnetic field directed across the separation area. A pair of Bloch lines is generated in every splitting process. The assignment of the lines to either one of the two resulting domains depending upon the wall state of its mother domain and the direction of the directed magnetic field. Instead of the directed magnetic field, velocity inducing forces can be applied to the elongated domain. The effect desired is to incline the wall magnetization in the elongated section of the domain. Controlled resplitting of domains having Bloch lines increases the number of Bloch lines in one domain to generate any predesignated wall state. The multiplicity of states which can be controllably generated anticipates their utilization beyond binary bit coding.

16 Claims, 15 Drawing Figures

METHOD AND APPARATUS FOR CONTROLLED GENERATION OF WALL TOPOLOGY IN MAGNETIC DOMAINS

BACKGROUND OF THE INVENTION

This invention relates generally to information storage devices and more particularly to thin film magnetic domain devices.

Field of the Invention

A single-wall or bubble domain is defined as a magnetic domain bounded by a domain wall which closes on itself in the plane of a host magnetic layer and has a geometry independent of the boundaries in which it is moved.

The term bubble domains includes circular-wall domains, elongated circular or stripe domains, and segment domains where a portion of the wall is completed by a magnetic discontinuity such as a semi-circular domain.

Inasmuch as a bubble domain is self-defined in a plane of movement, it is free to move in two dimensions and such a plane as is now well known. The magnetization in the domain wall is generally assumed to be of a Bloch wall type having its direction of magnetization lying in the plane of the magnetic sheet and in the plane of the domain wall. Since bubble domains can be propagated by the application of a gradient magnetic field and can be generated, stored and sensed, they have many applications in information storage devices.

DESCRIPTION OF THE PRIOR ART

In most of the prior art information storage systems using single-wall magnetic domains, data bits were generally represented as the presence and absence of bubble domains. This method was used initially in the development of magnetic domain systems since the nucleation or splitting of bubble domains or not at will was perhaps the easiest method of adapting the technology to a practical use.

Different domain properties useful for storage of information and the retrieval thereof were then discovered. In a copending U.S. patent application Ser. No. 319,130, filed on Dec. 29, 1972 now U.S. Pat. No. 3,911,411 and assigned to the same assignee as the present invention, domains having different apparent sizes were used to represent different information states. Another bubble domain property useful for storing information is that the magnetization in the wall of the domain can have a direction of rotation or chirality. The different directions of the rotation of the domain wall magnetization can be used as a binary representation of data. A publication by George Henry in the IBM Technical Disclosure Bulletin, Vol. 13, No. 10, page 3021, March 1971, discloses the adaptation of chirality to the bubble domain apparatus.

In the work being performed on magnetic bubble domains, it was discovered that magnetic domains have other dissimilar properties which serve to distinguish one from another. It was discovered that domains can have different numbers of vertical lines called Bloch lines which may roughly be thought of as a vertical line of twist in the wall magnetization. These lines separate two areas within the Bloch wall of the domain which have opposite directions of Bloch wall magnetization. It was further found that these different domains have different directions of movement in an applied gradient magnetic field.

The phenomena of the Bloch line was noted in a copending U.S. patent application, Ser. No. 344,659, filed on Mar. 26, 1973 now U.S. Pat. No. 3,940,750, and assigned to the assignee of the present invention. Since the discovery of the Bloch lines, there have been many articles discussing their properties including an article by A. P. Malozenoff, in *Applied Physics Letters* 21, page 149 (1972) where it was shown that if there are enough vertical Bloch lines along the domain wall of a bubble domain, then the domain will collapse at a higher bias field than one with a smaller number of vertical Bloch lines. In addition, the diameter and mobility may be different depending on the number of vertical Bloch lines.

A utilization of these different types of magnetic bubble domains was included in a copending U.S. patent application, Ser. No. 375,289, filed on June 29, 1973 now U.S. Pat. No. 3,890,605, and assigned to the assignee of the present invention. That application disclosed an information handling apparatus where the different motions of the magnetic bubble domains in a gradient magnetic field were used for representation of data. The important property of different angles of deflection of the bubble domains in a gradient magnetic field according to the wall state of the domain wall was recognized and disclosed therein. The angle of deflection was disclosed as a function of the number of rotations of wall magnetization around a peripheral of the domain wall. However, the generation of the bubble domains was essentially haphazard in that a multiplicity of domains were generated without regard for their properties. These domains were first sensed according to their deflection angle and then stored in a data bit bin according to the deflection angle sensed. A particular bit bin was then actuated to release a domain according to the data state required for storage into the formation storage system. Only the properties of the different domains were known at that tome such as that one domain when propagated in a common field gradient could deflect at a different angle from another domain. However, the controlled generation of domains having selected properties was not known.

The discovery of the Bloch lines led to the invention described in a copending U.S. patent application, Ser. No. 517,997, filed on Oct. 25, 1974, and assigned to the assignee of the present invention. That application discloses a method and apparatus for controllably generating and switching Bloch lines in a bubble domain. A magnetic film is exchange coupled to the bubble medium layer. Agitating the bubble in its layer while applying or not a unipolar in-plane magnetic field to the exchange coupled film provides a bubble having one of two wall states, depending upon whether or not the in-plane field is applied. The controlled generation of domains beyond the two states of no Bloch lines or one pair of Bloch lines was not discussed.

Accordingly, it is an object of the present invention to provide a magnetic domain arrangement providing controlled generation of a plurality of wall topologies of magnetic domains.

It is a further object of this invention to provide a method for the controlled generation of wall states in magnetic domains.

Another object of this invention is to predictably generate single-wall domains having a known wall topology.

Yet another object of this invention is to provide apparaus for controlling the generation of higher order states in a bubble magnetic domain.

Still another object is to provide apparatus for the controlled generation of bubble magnetic domains which does not require an exchange coupled layer to the bubble medium.

Yet another object is to provide an information storage device which utilizes the multiple states of the Bloch wall of magnetic bubble domains.

These and other objects of the present invention will become apparent to those skilled in the art as the description proceeds.

SUMMARY OF THE INVENTION

A magnetic domain arrangement is provided for the controlled generation of single wall or bubble magnetic domains with defined wall topologies. Apparatus is provided for generating magnetic single wall domains of a known construction by controlled nucleation in an in-plane magnetic field or domain splitting in the presence of a means that inclines the wall magnetization into a direction approaching traverse to the domain wall. The apparatus for generating single wall magnetic domains with defined and predictable wall topologies includes means for generating a single wall stripe domains, means for inclining the wall magnetization in the elongated section of the domain, means for positioning said domain, and means for splitting said stripe domain. The direction of wall magnetization inclination applied to the stripe domain during the splitting operation defines the location of one pair of Bloch lines of a known magnetic direction in one of the split or "daughter" domains. The control over the resulting states of the walls fo the single wall domains is achieved by first positioning the Bloch lines with respect to the splitting location in the mother domain and controlling the direction of the wall magnetization inclination in the splitting location.

In a second embodiment, open-ended segment domains with unichiral wall magnetization are generated by nucleation from an edge or discontinuity in the host magnetic material. The polarity of the unipolar control field across the nucleation areas controls the wall chirality. Domains with wall states of a state equal to 1, no Bloch lines, and a state equal to 0, one pair of Bloch lines, can be generated by splitting domains from the unichiral segment domain. The state of the domain generated depends upon the direction of chirality of the segment domain together with the direction of wall magnetization inclination directed across the splitting location.

The controlled generation of single wall magnetic domains having an increased number of Bloch lines for data representation in a data base larger than two can be generated by splitting domains from an original or mother domain N number of times while controlling the wall magnetization inclination across the splitting location. The mother domain with a unichiral wall magnetization is split leaving a domain with one pair of Bloch lines and a domain with a unichiral wall magnetization which is removed. The domain with the added Bloch lines if further controllably split while controlling the wall magnetization inclination in the splitting location. The unwanted split-off unichiral domains are annihilated or in some manner removed to another location. The number of Bloch lines in the remaining daughter domain is increased by two in each controlled splitting process. After $n$ number of splitting processes, one domain can acquire $n$ number of pairs of Bloch lines which domain can then represent a data bit of information in a number system with an arbitrarily large base value. Thus, by controlling the splitting operation and the wall topology, that is, the chirality and the number and polarity of Bloch lines of the domain to be split, a domain can be generated having a known wall state.

The method of controllably generating domains having a known wall topology comprises the steps of generating a domain having a known topology and splitting this domain in the presence of a means for inclining the wall magnetization. Domains of a higher wall state can be generated by repeating the splitting steps using domains having Bloch lines and performing the splitting at a particular location along the domains wall to accomplish the wall state required.

BRIEF DESCRIPTION OF THE DRAWING

Further features and a more specific description of an illustrated embodiment of the invention are presented hereinafter with reference to the accompanying drawing, wherein.

DESCRIPTION OF THE PREFERRED EMBODIMENT

Generally, the following description includes apparatus for generating, by domain splitting, predictable and reproducible single-wall domains for conventional domain information storage system and also predictable and reproducible domains having multiple state wall topologies suitable for a greater than binary base data representation. The domains generated are for a lattice type of information store such as disclosed in U.S. patent application, Ser. No. 395,336, filed on Sept. 7, 1973 entitled "Systems Using Lattice Arrays of Interactive Elements" and assigned to the assignee of the present invention.

The theory behind the instant invention is given in an article entitled "Domain Formation and Associated Wall States" by B. A. Calhoun and Otto Voegeli, the inventor of this application, published in the IEEE Transaction on Magnetics, Vol. MAG-9, No. 4, December 1973 at pp. 617–621. As is discussed therein, each splitting process creates a pair of Bloch lines. All Bloch lines produced in domain splitting have a given sense of rotation and are labelled as negative Bloch lines. Either one resultant domain acquires both lines or each of the two resulting domains acquires one of the lines, depending on the splitting mechanism and the topology of the walls to be split. The first process occurs when a direction of wall magnetization M in one wall segment is antiparallel to the magnetization of the other wall segment of the same domain to which it is to be recombined by the splitting process. The second process occurs when the Bloch lines in the mother domain are on opposite sides of the splitting point. In the present invention, one of the two resultant domain acquires both of the Bloch lines.

Although some theoretical aspects were discussed in the above publication, the results of domain splitting were indeterminate until the present invention. For instance on page 620, Experimental Evidence, it is stated that an original or mother bubble domain having a state S=0 can be split into two S=0 bubble domains, or one S=−1 and one S=1 bubble domain. The end result before applicant's invention was random. Applicant's invention shows how these processes can be controlled to obtain known wall states in the resultant domains after a splitting process.

Figure 1A:
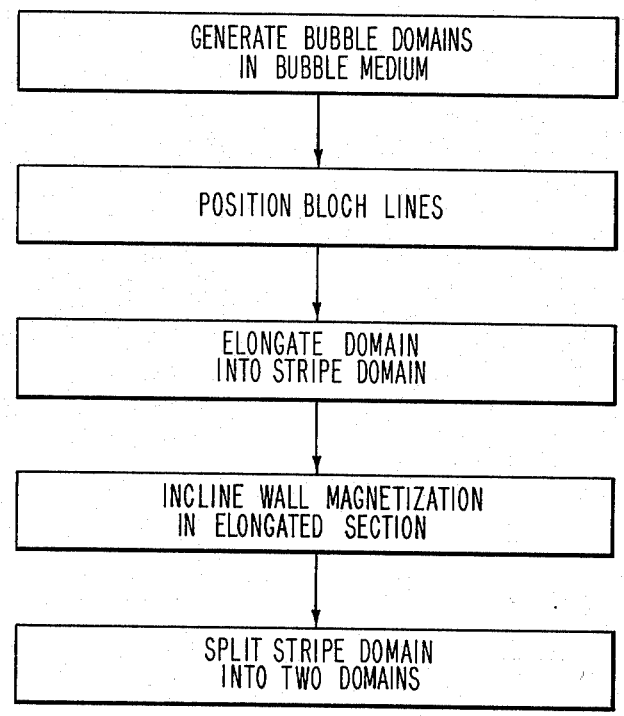
FIG. 1a is a flow diagram of a process for generating multistate bubble domains.
Figure 1B:
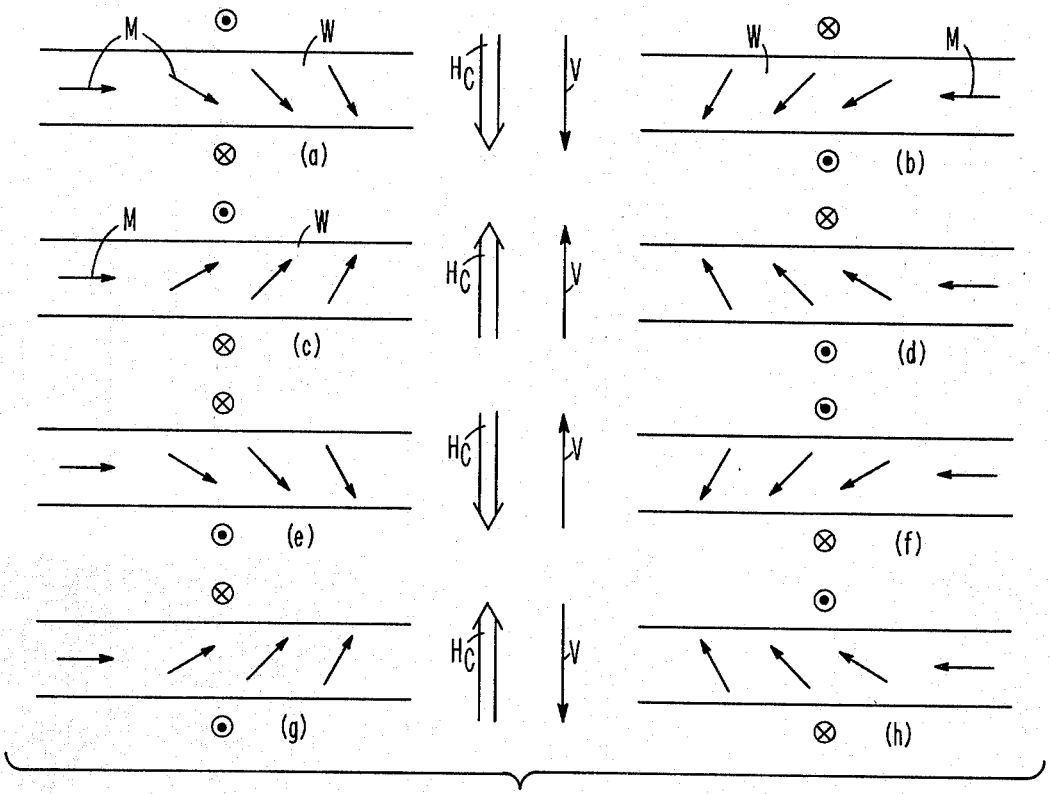
FIG. 1b illustrates the effect of an in-plane magnetic field and a velocity component to the wall magnetization direction of a bubble domain.
Figure 2A:
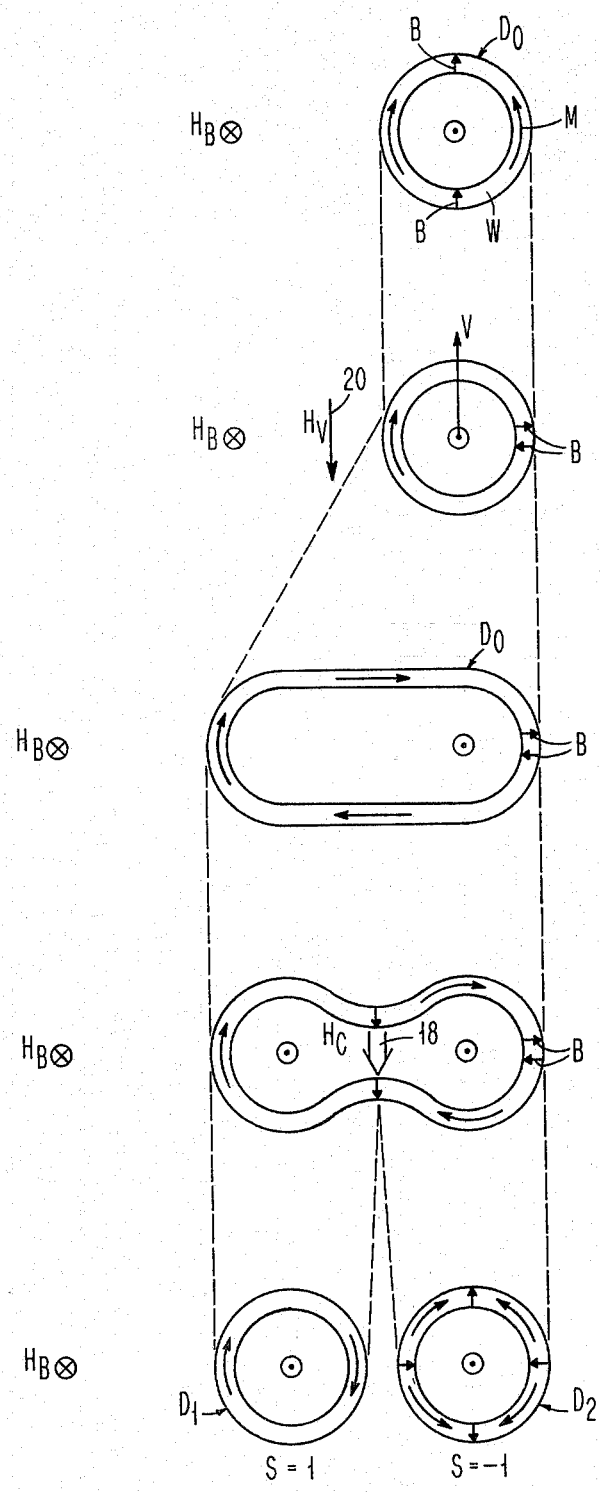
FIGS. 2a and 2b each show diagrams schematically illustrating the domain splitting for generating controlled wall state single-wall domain.
Figure 3:
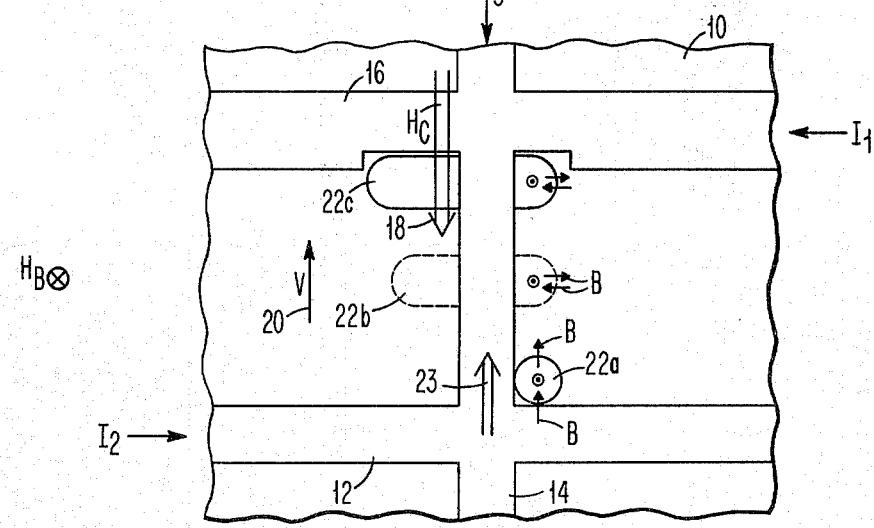
FIG. 3 shows an apparatus usable with the process according to FIG. 1.
Figure 4:
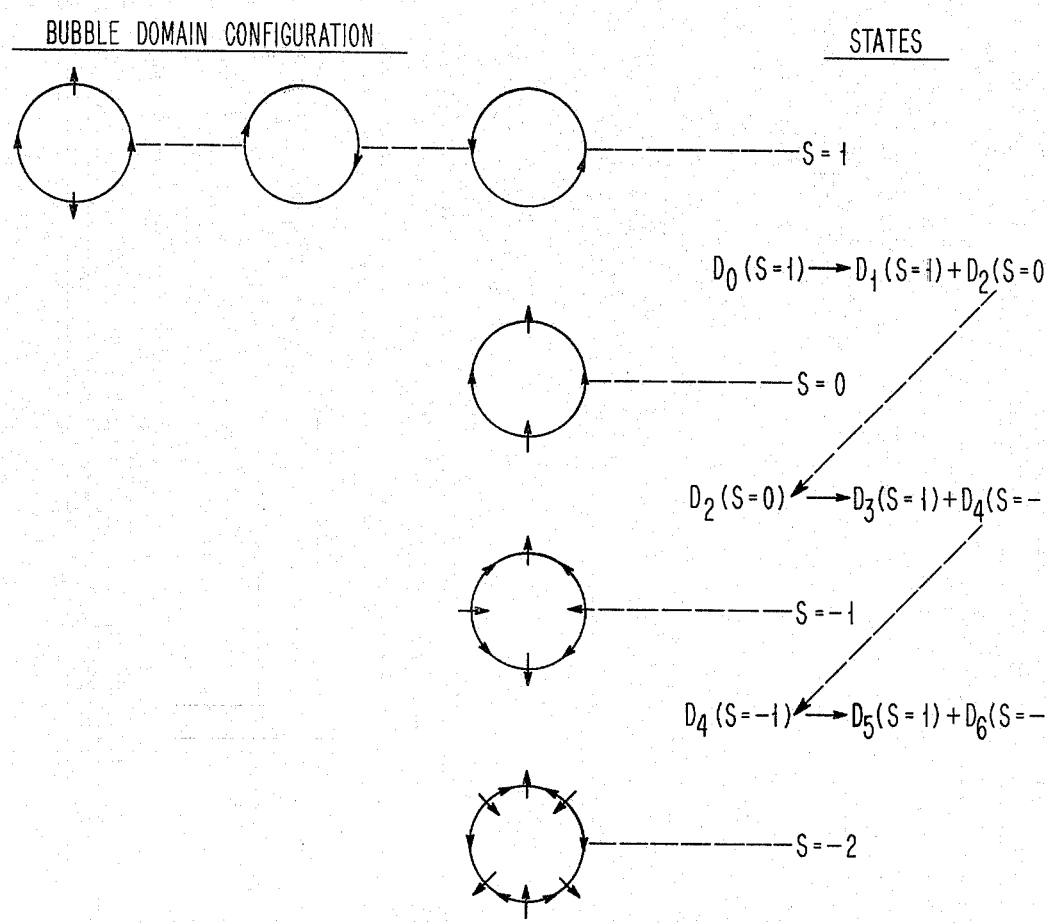
FIG. 4 shows several different wall states obtainable in single-wall domains.

The process steps for generating binary state and multistate bubble domains according to the present invention is shown in FIG. 1a. The visualization of the ocurrence to the bubble domain in the process is illustrated in FIGS. 1b, 2a db 2b. An apparatus for accomplishing the process is shown in FIG. 3. A representation of the different wall states achieved by the different bubble domains is shown in FIG. 4. For purposes of this description, wall state shall refer to the net rotation of wall magnetization. Wall state S thus measures the integral number of times the wall magnetization M rotates about the film normal moving once counterclockwise about the domain boundary. Wall topology is a more general term meaning the arrangement of wall magnetization including wall chirality as well as Bloch line position.

Referring to FIGS. 1, 2 and 3, the domain $D_0$ is generated preferably by nucleation in a host magnetic material 10 of a rare earth orthoferrite or garnet material, for example, by applying electrical currents $I_2$ and $I_3$ to conductors 12 and 14, respectively, in the presence of an in-plane magnetic field. The domain $D_0$ of diagram (a) of FIG. 2a includes two Bloch lines B within its wall W. For the purposes of this disclosure, a domain having one pair of Bloch lines is given a designation of a wall state S=0. The different states that can be acquired by a domain will be explained in more detail later in FIG. 4.

The nucleation of a bubble domain with a pair of Bloch lines can be accomplished by the activation of two transverse conductors by an electrical current as shown in FIG. 3 with the application of an in-plane control field at the nucleation site. The resultant bubble domain will have one pair of Bloch lines pointing in the direction of the unipolar in-plane control field. Using the current direction $I_2$ and $I_3$ and an in-plane field pointing in the direction of the arrow 23, a bubble domain 22a having a state S=0 with Bloch lines B will be nucleated.

The domain $D_0$ in FIGS. 2a and 3 is shown having a magnetization pointing out of the plane of the figure. This assumes that the convention is adapted that the host domain layer 10 is saturated magnetically in a negative or downward direction along an axis normal to the plane of the layer and that the magnetization of the single-wall domain are in a upward or positive direction along the same axis. Consequently, the bias field $H_b$ for the domains is shown having a negative direction into the plane of the figure.

The next step in the process is to position Bloch lines, if any, prior to the splitting process. This is achieved by translating the domain to a center position 22b. The translation of the domain moves the Bloch lines along the wall until they reach a steady stated position as indicated by domain 22b. The theory of such Bloch line motion, resulting from gyro-magnetic spaces within a moving domain all, has been discussed by G. P. Vella Colerio et al. in the article "Dynamic Properties of 'Hard' Magnetic Bubbles", published in the Physical Review Letter, Volume 29, Number 14, Oct. 2, 1972. Once the Bloch lines have reached the indicated position, their position remains unchanged by further translation as is shown by the domain in position 22c. Domain translation for Bloch line positioning is produced by currents $I_1$ and $-I_2$. If current $I_1$ is of sufficient magnitude to lower the bias field $H_b$ below the run-out field, the domain will assume the elongated shape of the stripe domain 22c. The final domain length is determined by the current concentration produced by the constricted geometry of conductor 16.

The next step is to incline the wall magnetization in the elongated section by either applying a unipolar in-plane control field Hc or a velocity component to the elongated domain. This is shown in FIG. 1b. The tilt or inclination direction of the wall magnetization as a result of the in-plane field or the velocity component depends upon the magnetization direction of the domain and the Bloch wall magnetization direction.

Referring to FIG. 1b, the different diagrams, (a)–(h), show the reaction of the wall magnetization M within the Bloch wall W according to the direction of an in-plane magnetic control field Hc or a velocity producing means. The arrows Hc and V shows the applied control field direction and the motion direction, respectively, of the diagrams on either side of the arrows. For instance, in diagrams (a) and (b), the direction of the magnetic control field produces the same downward inclination direction in the wall magnetization direction.

The inclination direction of the wall magnetization as a result of the velocity direction V depends on the direction of magnetization of the bubble domain relative to the media and the direction of the wall magnetization. This is more fully described in the article "Ferromagnetic Domain Theory", by C. Kittel and J. K. Galt in "Solid State Physics 3", (1956) at p. 437.

The inclination of the wall magnetization produced in the domain $D_2$ of diagram (d) of FIG. 2a is shown in more detail in diagrams (e) and (f) of FIG. 1b, with diagram (e) representing the top wall of the domain in the plane of FIG. 2a and diagram (f), the bottom wall.

The next step in the process of FIG. 1a is to split the stripe domain into two domains while the wall magnetization is inclined. This is accomplished in the diagram of FIG. 3 when the current $I_3$ in conductor 14 is pulsed while the stripe domain is positioned thereunder. Means for elongating and splitting bubble domains are well known as evidenced by the U.S. Pat. No. 3,727,197 issued to Hsu Chang on Apr. 10, 1973 and entitled "Magnetic Means for Collapsing and Splitting of Cylindrical Domains". The means shown in FIG. 3 should not be taken to limit the present invention to the particular apparatus, it being evident that other apparatus could be substituted by those skilled in this art.

Referring to FIG. 3, the direction of the current $I_3$ determines the edge of conductor 14 at which the stripe domain splits and reforms. The two walls of the stripe domain will recombine in the region of the in-plane control field $Hc$ and the domain $D_0$ is split into two domains $D_1$ and $D_2$ as shown in FIG. 2a. According to the present invention, domain $D_1$ will have a state $S=1$ having no Bloch lines. Domain $D_2$, however, since the recombining of the walls is under the influence of the control field $H_c$, will have two pairs of Bloch lines pointing in the direction of the applied control field $H_c$. Domain $D_2$ is therefore considered to have a state $S=-1$. By a similar process with the unipolar in-plane field $H_c$ pointing in an upward direction, it can be similarly shown that domain $D_1$ will have a pair of Bloch lines pointing in an upward direction with domain $D_2$ keeping its one pair of Bloch lines. Both daughter domains will have a state $S=0$.

It should be evident from diagrams (e) and (f) of FIG. 1b that a velocity component V applied to the elongated stripe domain in diagram (d) of FIG. 2a, in the reverse direction as the direction of the in-plane control field $Hc$ will accomplish the same wall magnetization inclination direction. Therefore, the resultant bubble domains $D_1$ and $D_2$ will have the same wall states. Domain $D_1$ will have a state $D=1$, no Bloch lines, and domain $D_2$ will acquire all four Bloch lines. The Bloch lines B in diagram (c) are both on one side of the splitting mechanism, the wall magnetization M at the split is antiparallel and therefore one domain will get both added Bloch lines.

For utilization purposes, the domain having a state $S=1$ can be annihilated and the state $S=-1$ domain can be either used or placed through the process again to obtain a more negative state bubble domain as shown in FIG. 4. The several pairs of Bloch lines for the more negative state bubble domain can be localized by propagation as before, elongated into a stripe domain and split in a unipolar in-plane field to add another pair of Bloch lines. Thus, bubble domains of many different wall topologies can be produced and stored in the utilization means for usage therein to represent numbers having a base in excess of two. Several ways of accomplishing domains of wall topologies usable for storing data are shown in FIGS. 8 and 9 and will be discussed later.

Figure 2B:
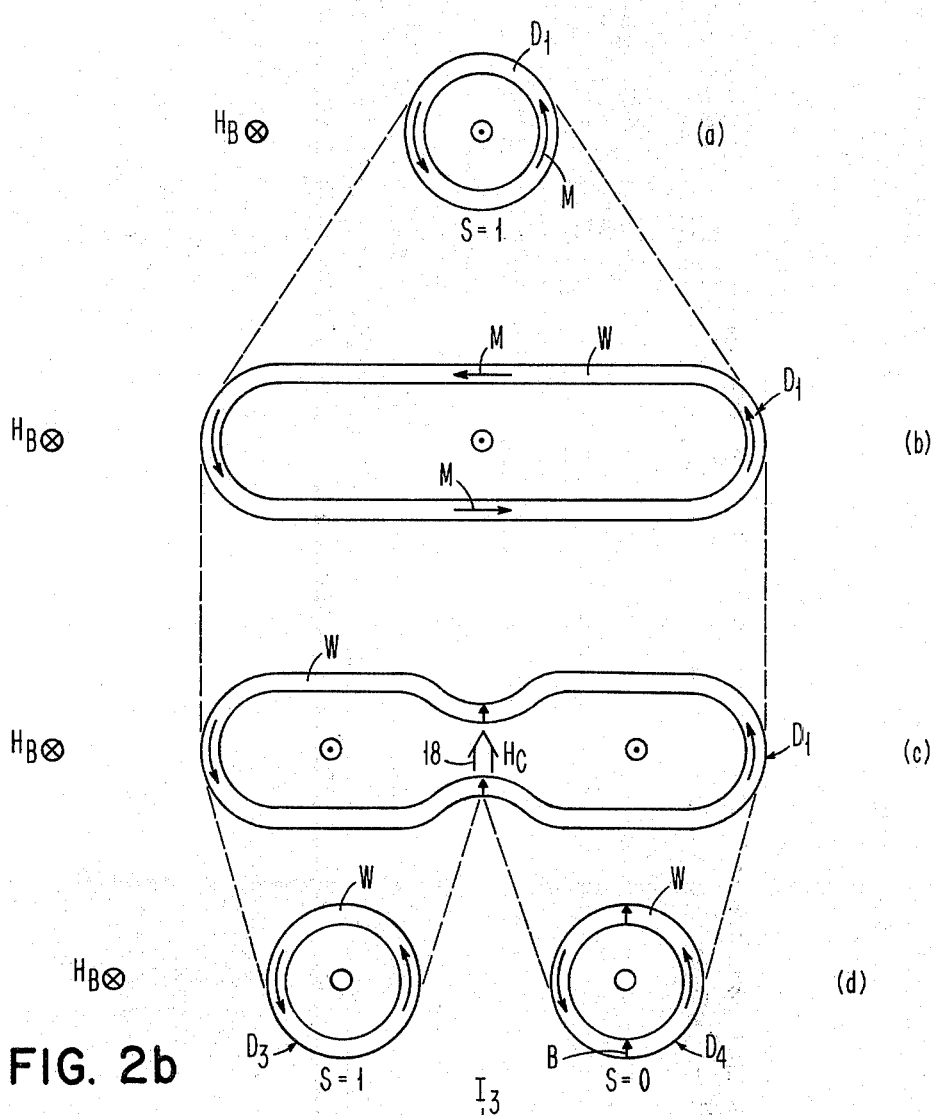

The bubble domain $D_1$ of FIG. 2a can be used to produce two bubble domains usable to represent binary data as shown in FIG. 2b. Referring to FIG. 2b, the domain $D_1$ can be taken through the process steps of FIG. 1a to develop two daughter domains $D_3$ and $D_4$. Since a domain having a state $S=1$ has no Bloch lines, the step of positioning the Bloch lines is not required.

Thus, if a bubble domain having a state $S=1$ is generated according to the steps just discussed for FIG. 2a, this domain can be elongated, have its wall magnetization inclined, and split into two domains. The result is the steps diagrammed in FIG. 2b.

After the step of elongating the bubble domain, the domain D, in diagram (b) of FIG. 2b has the wall magnetization structure as shown in diagram (c) and (d) of FIG. 1b, with diagram (c) representing the lower wall in the plane of FIG. 2b and diagram (d) representing the upper wall. Thus, a velocity component V or a unipolar in-plane magnetic field $H_c$ in the same direction will cause a wall magnetization inclination direction in an upward direction resulting in domain $D_4$ getting the added pair of Bloch lines.

If the velocity component V or the magnetic control field $H_c$ is reversed in direction, the wall magnetization inclination direction will be as shown in diagram (a) and (b) of FIG. 1b. The result would be that domain $D_3$ would receive the pair of Bloch lines and domain $D_4$ would have no Bloch lines.

The two bubble domains generated in FIG. 2b are usable to represent binary data information. The bubble domain having a state $S=1$ can be recirculated in the process of FIG. 2b to continually generate bubble domains having a state $S=0$ for storage by the utilization means.

The process as developed in FIG. 2b can be the generating process step in arriving at the daughter domains shown in FIG. 2a. The process described in FIG. 2b can therefore become a recirculating device. The domain $D_3$ is recirculated and reused and the domain $D_4$ is used in a process according to FIG. 2a to produce two domains usable to represent binary data.

FIG. 4 shows the wall state S of various domains with an appendant wall topology. In FIG. 4, arrows designate wall chiralities and Bloch line polarities, respectively. The three domains having a wall state S equal to 1 exemplify that S is unchanged by line pairs with opposite sign (left most domain). Such Bloch lines can unwind while the magnetization remains continuous to yield either of the two other domains shown with the same state. In contrast, a transition between different states requires a discontinuity in the spin distribution and is thus opposed by an exchange energy barrier. As a result of this barrier, domains retain the state acquired during their formation over a fairly wide range of drive conditions. Wall states are unlimited in integer values and therefore the number shown in FIG. 4 should not be taken as limiting the present invention. An algebraic representation of the splitting process is shown between each state for the domains of FIGS. 2a and 2b, and a further state $S=-2$ is shown.

Every domain splitting process creates a new pair of Bloch lines with the resulting two domains having wall states whose sum equals the state of the original domain. Without chiral switching, the most positive state possible, after N number of splitting processes, is 1. The most negative state possible is either $-N$ or $1-N$, depending on whether the first domain was nucleated within or from an edge of the sample. If an N number of splitting processes $N+1$ number of closed domains are generated from a first domain, then the sum of the $N+1$ states equals the state of the first domain. In terms of Bloch lines therefore, after N number of splitting processes there are 2N more lines with a state $-½$ in the sample than there are lines with state $+½$.

Figures 5A, 5B:
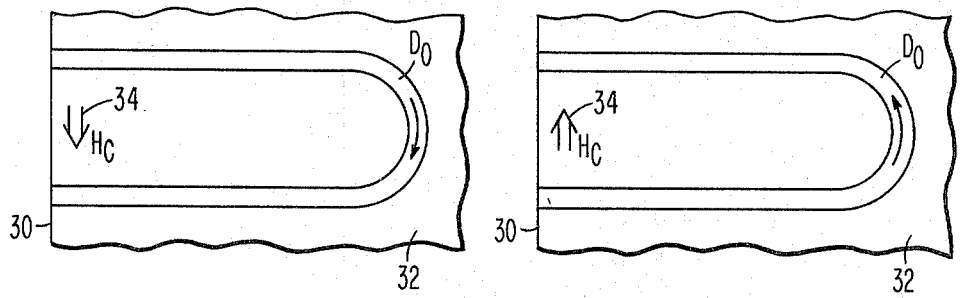
FIGS. 5a and 5b show apparatus for controlled generation of a domain segment with a predictable wall chirality.

FIGS. 5a and 5b show a visual representation of the generation of open-ended mother domains $D_0$ with unichiral wall magnetization. In FIG. 5a the domain $D_0$ having a clockwise chiral wall topology is generated by nucleation from an edge 30 or some magnetic discontinuity in a host domain layer 32. A unipolar in-plane control field $H_c$ is generated across the edge 30 of the host layer 32. To generate a domain $D_0$ having the clockwise chirality, the polarity of $H_c$ must be in the direction of the arrow 34 shown in FIG. 5a pointed in a downward direction in the plane of the figure. Further as shown in FIG. 5b, a unichiral domain $D_0$ having a different wall topology but the same state $S=1$ can be controllably generated by reversing the direction of the unipolar in-plane field $H_c$. The field $H_c$ is shown pointed upward in the plane of the figure creating a domain $D_0$ having a counterclockwise chiral wall topology. Thus, the polarity of the field $H_c$ across the nucleation area controls the wall chirality of the resultant domain. As is well known in the art, the direction of chirality of domains can be used to store binary data. Further, the unichiral domains can be further split to form domains having a multiple state wall topology as shown in FIGS. 6a and 6b.

Figure 6A:
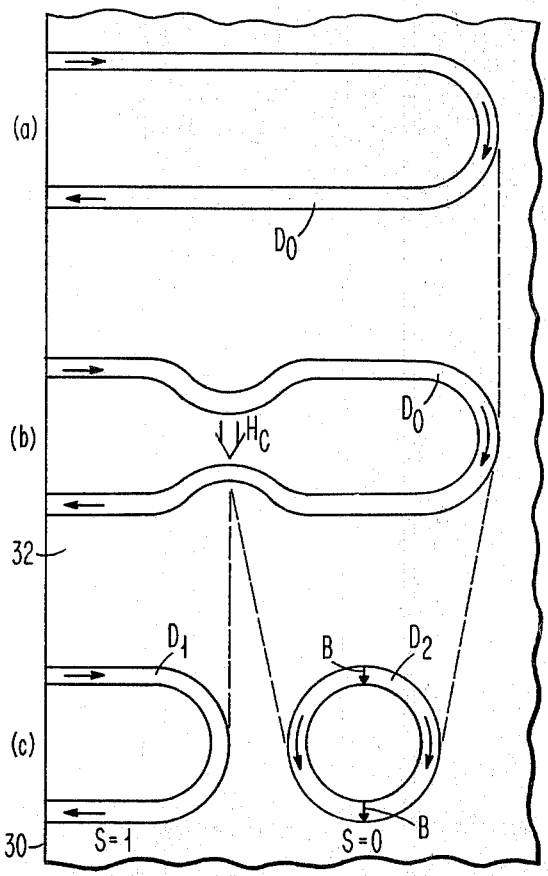
FIGS. 6a and 6b each show three diagrams illustrating the method steps and apparatus for generating domains with controlled wall states from a domain segment.

Referring to FIG. 6a, the domain $D_0$ is shown generated by nucleation in diagram (a) from the edge 30 or some discontinuity in the host domain layer 32. The domain $D_0$ has a clockwise chirality. In diagram (b), a unipolar in-plane field $H_I$ is generated as a wall magnetization inclining means across some section of the elongated domain segment. The two walls of the domain $D_0$ are then recombined by a conductor for instance, to form a unichiral segment domain $D_1$ attached to the edge 30 and a circular or bubble domain $D_2$ with a pair of Bloch lines B separating the chiral wall segments of the domain $D_2$. As shown in diagram (c) of FIG. 6a, the direction of chirality of the original mother domain $D_0$ and the direction of the in-plane field $H_c$ determined the wall state of the segment and the resultant bubble domain. In FIG. 6a the domain $D_1$ has a state $S=1$ while the domain $D_2$ has a state $S=0$ (see FIG. 4).

Figure 6B:
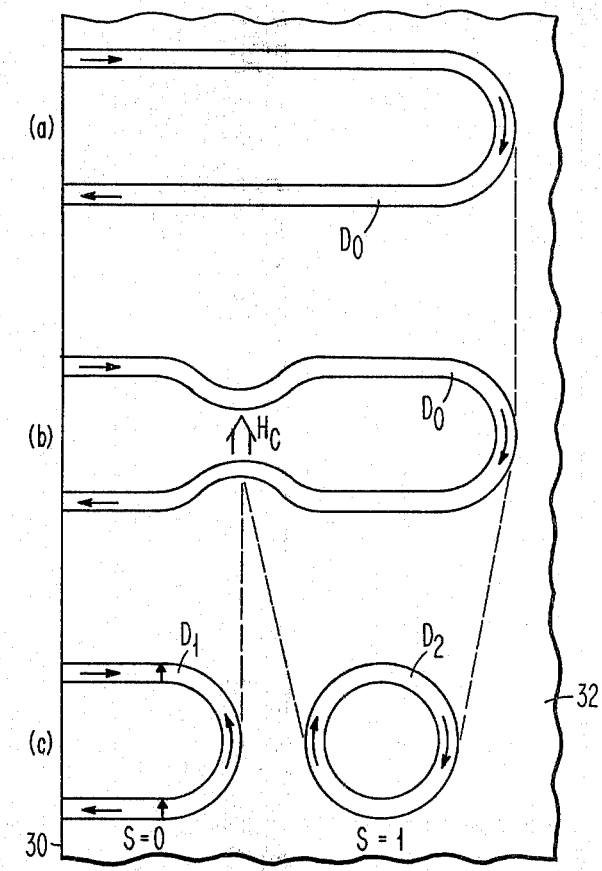

In FIG. 6b, a domain $D_0$ having the same clockwise unichiral wall topology as shown in FIG. 5a is illustrated. In diagram (b) of FIG. 6b, the in-plane field $H_c$ is in the opposite or upward direction across the domain segment $D_0$ to that applied in FIG. 6a. With the opposite polarity of field $H_c$ and after the splitting process as shown in diagram (c), resultant segment domain $D_1$ has a state $S=0$ with a pair of Bloch lines in its wall. Domain $D_2$ has a state $S=1$ since it is a unichiral bubble domain. Thus, by nucleating a bubble domain across an edge or discontinuity of the host magnetic material in a unipolar in-plane field, a controlled chirality segment domain can be created. This segment domain can be further split in a unipolar in-plane field directed across the segment to controllably generate a bubble domain having a known wall topology depending upon the chirality of the nucleated domain and the direction of the in-plane field placed across the segment. It is further obvious that the segment domain $D_1$ of FIG. 6b can be further elongated and further split as described previously to obtain multiple state wall topology segment or bubble domains. Also the domain $D_2$ of FIG. 6a could be elongated as shown in the steps of FIG. 2b and controllably split in the presence of a directed unipolar in-plane field to creat higher state bubble domains.

Thus, another process for controllably generating bubble domains of a known wall topology includes the steps of applying a unipolar in-plane field across an edge or discontinuity of a bubble medium and generating an elongated segment domain from this edge of the bubble medium, as shown in FIGS. 5a and 5b, inclining the wall magnetization in the elongated section of the segment bubble domain and splitting the segment domain into two domains. By controlling the inclination direction of the wall magnetization through the applied in-plane field or a velocity inducing means, the resultant segment bubble domain and circular bubble domain will have a known wall topology, as shown in FIGS. 6a and 6b.

Figure 7:
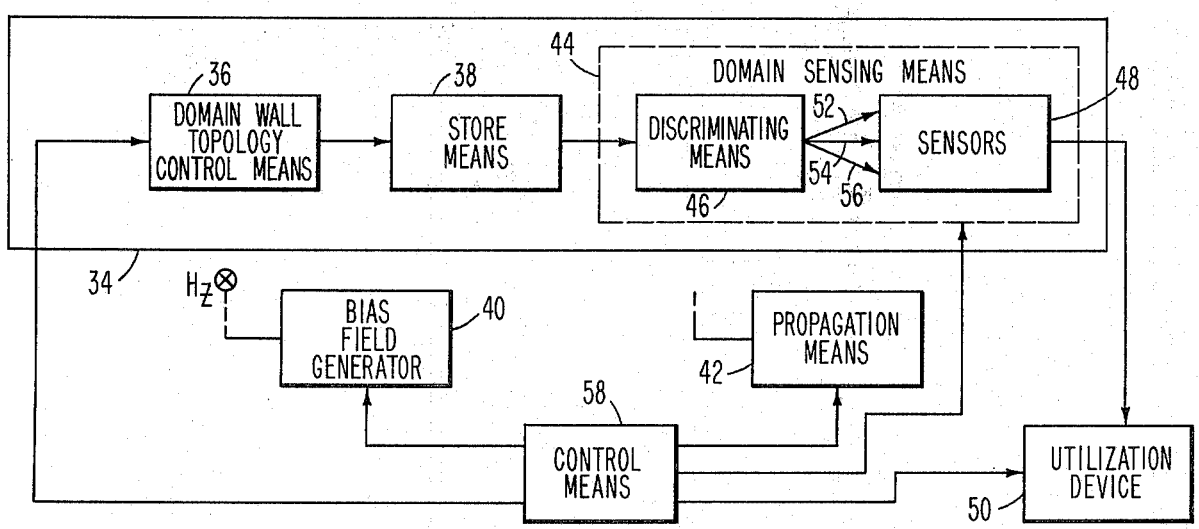
FIG. 7 shows a block diagram of an information storage system in which magnetic domains with a multiplicity of wall states are utilized.

FIG. 7 shows a block diagram of an information storage system using magnetic domains having dissimilar wall topologies each with different dynamic properties. For a complete description of a magnetic domain system using different wall topology magnetic domains, reference is herein made to the aforementioned U.S. Patent Application, Ser. No. 395,336, filed on Sept. 7, 1973, and the description is incorporated herein for the purposes of showing a system utilizing the domains produced according to the present invention. As was discussed in that application, domains having different wall states deflect at a different angle in a uniform field gradient. Thus by using this different deflection characteristic an information store can, by using the present invention, store data having a base in excess of two.

The information store of FIG. 7 comprises a host magnetic layer 34 in which the domains exist. A domain wall topology control means 36 generates the domains having specific wall topologies according to the present invention and the data information to be stored in a store means 38 in the information storage device. A bias field generator 40 generates the field $H_z$ which controls the size of the domains in the host layer. A propagation means 42 controls the propagation of the domains in the host layer. There are many types of propagation means that can be used to suffice for the present invention including the well known T and I bar configuration as well as conductors and others well known in the art. The store means 38 could be any of the conventional bubble stores including a bubble shift register of common design or a lattice.

To retrieve data stored in the store means 38, the bubble domains are propagated into a domain sensing means 44 comprising for the preferred embodiment, a discriminating means 46 and sensors 48. The discriminating means 46 capitalizes on the property of the domains having different wall states that all domains of one state will follow a certain path which path is different for other states. The domains can be selectively taken from the store means 38 and sent to the discriminating means 46 where they can be detected such as by being deflected into the different paths 52, 54 or 56 depending upon the wall state of the particular domain. The discriminating means 46 separates domains having different properties representing different data so that each domain can be individually detected by the sensors 48. The sensors 48 can comprise any type of magnetic domain sensing equipment such as magnetoresistive sensors.

After being detected, the domains are either destroyed, sent to further circuitry, or returned to the domain wall topology control means 36 where they are selectively separated to indicate a specific data information again. A signal indicating the type of domain detected is sent to a utilization device 50 for use therein. The control of the sequences of operation for the domain wall state control means 36, the bias field generator 40, the propagation means 42, the domain sensing means 44, and the utilization device 50 is under the control of a control means 58. The control means 58 controls the sequence of operation to form the domain according to the data required, to propagate the domain into the store means for storage, and then out of the store means for sensing when retrieval is required. The various means and circuits shown in FIG. 9 may be any such element capable of operating in accordance with this invention.

Figure 8B:
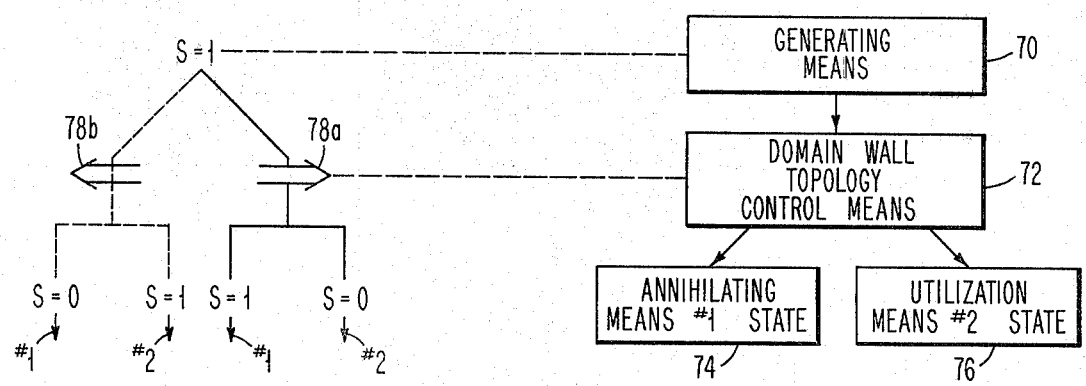
FIGS. 8a and 8b illustrate a block diagram and symbolic representation of different ways of adapting the present invention to a practical use.
Figure 8A:
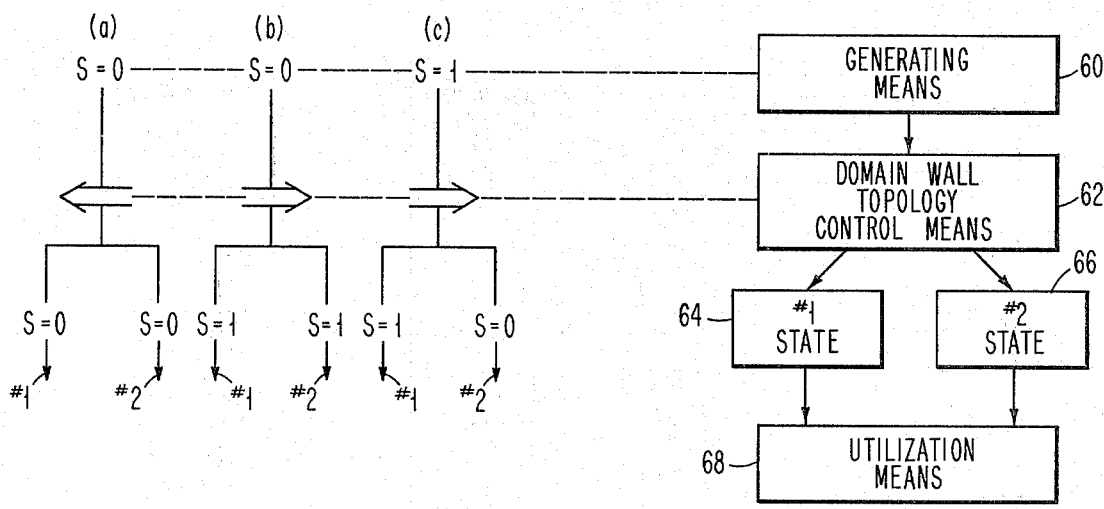

In FIGS. 8a and 8b are illustrated in block diagram form and symbolic representation, various applications of the instant invention to a useful end. Referring to FIG. 8a, the block diagrams illustrate that bubble domains can be nucleated or otherwise generated in a generating means 60, can be elongated, have its wall magnetization inclined, and be split in a controlled wall state forming means 62, which results in two bubble domains having a No. 1 state 64 and a No. 2 state 66. The bubble domain can then be selectively used by a utilization means 68 for any binary representation.

The three symbolic representations (a), (b), and (c) of FIG. 8a illustrate the potential states obtainable by changing the original bubble domain state and/or the direction of the wall magnetization inclining means such as the velocity or in-plane magnetic field direction. The wall magnetization inclining means is represented by the arrows in the three flow symbolic representations. In FIG. 8a (c), if a bubble domain starts with a state $S=1$, see FIG. 2b, the resulting bubble domain states are $S=1$ and $S=0$. The No. 1 and No. 2 states flow paths are labled in the flow symbolic representations in the same position as in the block diagram.

Diagram representations (a) and (b) illustrate that reversing the wall magnetization inclination direction results in different daughter domain states. Diagram (b) is representative of the procedure shown in FIG. 2a.

FIG. 8b shows that a system can result with a binary representation by bubble domain states without requiring a decision in the utilization means. The block diagram includes a generating means 70 and a controlled wall state forming means 72 connected to an annihilating means 74 and a utilization means 76. Symbolically represented, therefore, the bubble domains developed on the right, No. 2 states, are used while the bubble domains developed on the left, No. 1 states, are annihilated.

A bubble domain in nucleated or otherwise generated in the generating means 70 having a state $S=1$. The wall magnetization inclining means of the controlled wall state forming means 72 is direction activated according to the one of two bubble domain states required. If a bubble domain having a state $S=1$ is required, the left or dotted path is taken. The domain having the state $S=0$ is annihilated in the annihilating means 74. If the reverse is required, the inclining means direction is reversed as represented by the arrow 78a which is pointing in the opposite direction to the arrow 78b in the dotted line path. Using the solid line path with the reversed wall magnetization means direction, the utilized domain will have a state $S=0$ while the annihilated bubble domain will have a state $S=1$.

Figure 9A:
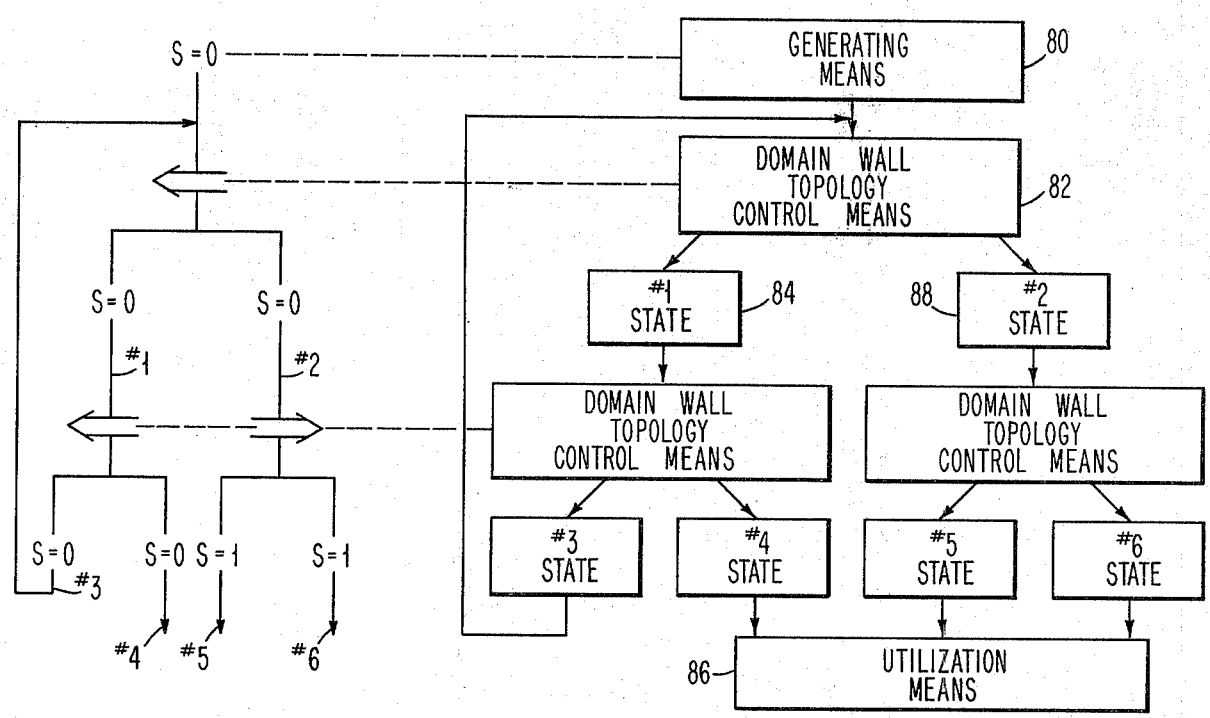
FIGS. 9a and 9b illustrate in a block diagram and symbolic form, the combination of the separate elements of FIGS. 8a and 8b to reach higher base symbols.
Figure 9B:
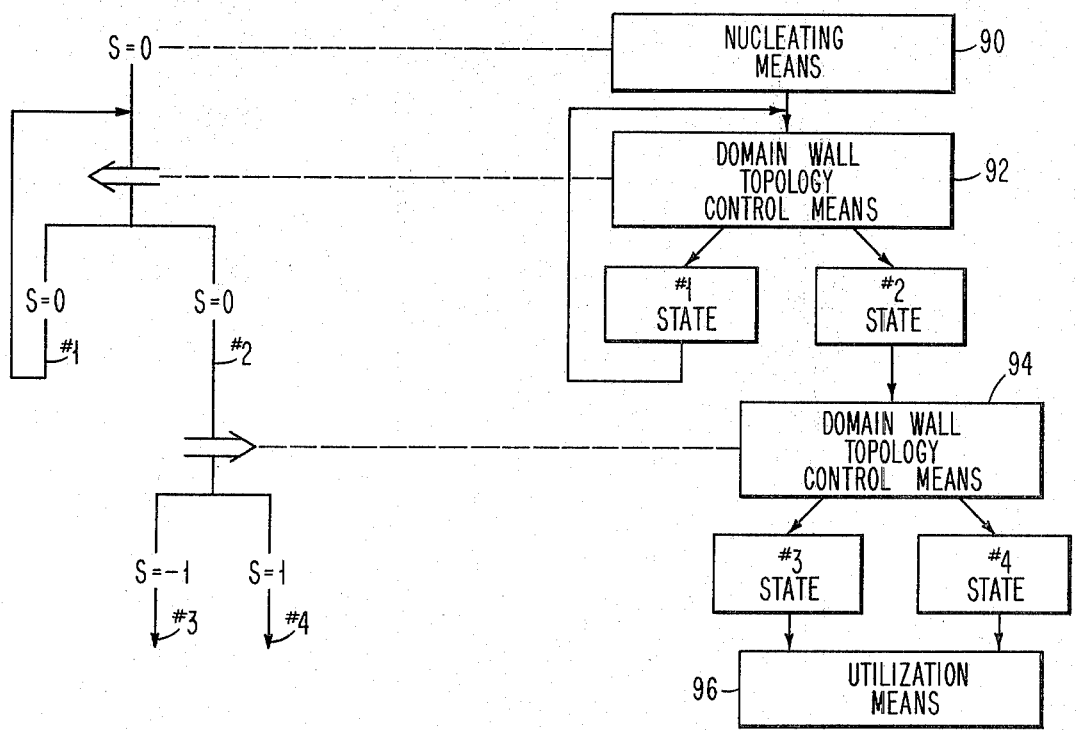

Similar diagrams are shown in FIGS. 9a and 9b. In FIG. 9a, three controlled wall state forming means are combined to provide a ternary system instead of a binary system. A generating means 80 starts by generating a bubble domain having a state $S=0$. This domain is directed to a controlled wall state forming means 82 wherein two domains both having a state $S=0$ is generated. The No. 1 state bubble domain is directed to the second controlled wall state forming means 84 which operates on the bubble domain in the same fashion as the controlled wall state forming means 82. Again the resultant bubble domain with a No. 3 and No. 4 state both have a state $S=0$. The No. 3 state domain is recycled so that another bubble domain will not have to be nucleated in the generating means 80. The No. 4 state bubble domain is directed to a utilization means 86.

The No. 2 state bubble domain is directed to the third controlled wall state forming means 88 wherein the wall magnetization inclining means is reversed relative to the controlled wall state forming means 82 and 84. As shown in FIG. 8a, the resultant bubble domain No. 5 state and No. 6 state will have a wall state $S=-1$ and $S=1$, respectively. These domains are also directed to the utilization means 86.

The utilization means 86 thus can select one of three domains as representing a ternary system storage. It should be evident that higher than binary and ternary states are possible using the present invention. Further controlled wall state forming means can be added to accomplish a domain having a wall state $S=-2$ and then a quadruplex system can be developed.

Other combinations of systems as shown in FIGS. 8a and 8b can be connected to attain different binary and higher base bit storage systems. For instance, in FIG. 9b, a recirculating binary system is shown wherein the bubble domains utilized are further separated in wall states. A nucleating means 90 starts by generating the first bubble domain having a wall state $S=0$. This domain is directed to a controlled wall state forming means 92 wherein both resultant domains, No. 1 state and No. 2 state, have a wall state $S=0$. The No. 2 state domain is shown directed to another controlled wall state forming means 94. The No. 1 state domain is recirculated so that no further domains need be nucleated.

The controlled wall state forming means 94 uses the opposite wall magnetization direction means to generate a No. 3 and No. 4 state domains having a state $S=-1$, respectively. These domains are then directed to a utilization means 96.

The domain having a wall state $S=-1$ and 1 are used because the difference between the two domains is 2 pairs of Bloch lines. Binary data is therefore not easily lost if, by some manner, the domain having a state $S=-1$ loses one pair of Bloch lines.

The principles of the invention have now been made clear in an illustrative embodiment. It will be immediately obvious to those skilled in the art many modifications of structures, arrangements, proportion, the elements materials and components used in the practice of the invention. For instance, a stripe domain is shown in the preferred embodiment being created by decreasing the bias field normal to this plane. It is evident that a stripe domain can be formed by other methods such as by the use of a loop conductor which causes a bubble domain entering the loop to elongate into a stripe domain. Further, other sensing means which uses other properties of the multistate domains than the deflection property can be used. For instance, the number of lines in the Bloch wall of a domain can be sensed directly by magnetoresistive sensing to sense the different states of the multistate domain. The appended claims are therefore intended to cover and embrace any such modification, within the limits only of the true spirit and scope of the invention.

I claim:

1. A process for controllably generating wall states in magnetic bubble domains in a medium supporting said domains, said wall states capable of representing data information, said process comprising the steps of:
a. generating a bubble domain in said medium;
b. positioning Bloch lines, if any, in said generated domain;
c. elongating said generated domain to obtain a stripe domain;
d. inclining the wall magnetization in the elongated section of said stripe domain substantially transverse to said domain wall; and
e. splitting said stripe domain into two bubble domains.

2. A process as described in claim 1 wherein the step of generating a bubble domain is performed by nucleating a bubble domain in proximity to a unipolar in-plane magnetic field.

3. A process as described in claim 1 wherein the step of generating a bubble domain includes steps (a) to (e) with one bubble domain after the splitting step being used as the generated bubble domain.

4. A process as described in claim 1 wherein the step of inclining the wall magnetization is performed by applying a unipolar in-plane field across the elongated section of said stripe domain.

5. A process as described in claim 1 wherein the step of inclining the wall magnetization is performed by applying a velocity component to said stripe domain to move said domain in a direction perpendicular to said elongated section to accomplish the substantially transverse wall magnetization inclination.

6. A single-wall magnetic domain arrangement for the controlled generation of wall states in magnetic domains in a medium capable of supporting said domains, said arrangement comprising:
means for generating a bubble domain of a known wall magnetization state in said medium;
means for elongating said domain into a stripe domain;
means for inclining the wall magnetization direction in the elongated section of said stripe domain transverse to the domain wall; and
means for controllably splitting said stripe domain.

7. An arrangement as described in claim 6 wherein said splitting means produces a first bubble domain having a unichiral wall state and a second bubble domain having a pair of line magnetization twists in its Bloch wall, and further including:
means for activating said elongating means to elongate said second bubble domain;
means for positioning said pair of line magnetization twists in said second bubble domain;
means for activating and controlling said inclination direction means; and
means for controllably splitting said second domain.

8. An arrangement as described in claim 7 wherein the direction of said inclination direction means is such that said splitting means for said second domain produces a third bubble domain having a unichiral wall state and a fourth bubble domain having two pairs of line magnetization twists in its Bloch wall, and further including means for repositioning said bubble domain with the plurality of line twists and for activating said elongating means, said positioning means, said inclination direction means and said splitting means to controllably generate bubble domains having a plurality of pairs of line magnetization twists by repositioning the resulting bubble domain with the plurality of line twists and reactivating the various means to add a pair of line magnetization twists to the resulting bubble domain each time the resulting bubble domain is repositioned and the various means are activated.

9. An arrangement as described in claim 6 wherein said inclination direction means includes a unipolar in-plane magnetic field directed across the elongated section of said stripe domain.

10. An arrangement as described in claim 6 wherein said inclination direction means includes a velocity component generating means for moving said stripe domain perpendicular to the elongated section of said stripe domain.

11. A process for controllably generating wall states in bubble domains, said wall states capable of representing data information, comprising the steps of:
a. providing a magnetic discontinuity in said medium;
b. generating a unipolar in-plane magnetic field in proximity and parallel to said magnetic discontinuity;
c. nucleating a segment domain from the magnetic discontinuity in the influence of said generated magnetic field;
d. elongating said nucleated segment domain;
e. inclining the wall magnetization in the elongated section of said segment domain substantially transverse to said domain wall; and
f. splitting said segment domain to generate a bubble domain from said segment domain.

12. A process as defined in claim 11 further including the steps of:
g. positioning Bloch lines, if any, in said generated bubble domain;
h. elongating said generated domain to obtain a stripe domain;
i. inclining the wall magnetization in the elongated section of said stripe domain substantially transverse to said domain wall; and
j. splitting said stripe domain into two bubble domains.

13. An arrangement for the controlled generation of wall states in magnetic domains in a medium capable of supporting said domains, said wall states capable of representing data information, said arrangement comprising:
means for generating a first bubble domain in said medium having one pair of line magnetization twists in the wall of said first domain;
a first domain wall topology control means including means for positioning the line magnetization twists in said domain, means for elongating said domain into a stripe domain, means for inclining the wall magnetization direction in the elongating section of said stripe domain, and means for controllably splitting said stripe domain into a second and a third bubble domain, said inclining means inclining the wall magnetization such that both the second and third domains have one pair of line magnetization twists;
a second wall topology control means essentially the same as said first wall topology control means operating on said second domain to produce a fourth and a fifth domain each having one pair of line magnetization twists;
a third wall topology control means similar to said first wall topology control means operating on said third domain except that said inclining means inclines the wall magnetization of said third domain in an opposite direction to that of said first domain to produce a sixth and a seventh domain having a different wall state from said third domain and from each other; and a utilization means receiving said fifth, sixth and seventh domains for usage therein.

14. An arrangement as defined in claim 13 wherein said fourth domain is directed to said first domain wall topology control means to provide a recirculating arrangement to cyclically produce repetitive fifth, sixth and seventh domains for usage in said utilization means.

15. An arrangemment for the controlled generation of wall states in magnetic domains in a medium capable of supporting said domains, said wall states capable of representing data information, said arrangement comprising:

means for generating a unipolar in-plane field;

means for nucleating a bubble domain in the influence of said in-plane field to produce a domain having one pair of wall magnetization twists;

a first domain wall topology control means including means for positioning the line magnetization twists in said domain, means for elongating said domain into a stripe domain, means for inclining the wall magnetization direction in the elongating section of said stripe domain, and means for controllably splitting said stripe domain into a second and a third bubble domain, said inclining means inclining the wall magnetization such that both the second and third domains have one pair of line magnetization twists;

a second domain wall topology control means similar to said first wall topology control means operating on said third domain except that said inclining means inclines the wall magnetization of said third domain in an opposite direction to that of said first domain to produce a fourth and fifth domain having a different wall state from said third domain and from each other; and a utilization means receiving said third and fourth domain for usage therein.

16. An arrangement as defined in claim 15 wherein said second domain is directed to said first domain wall topology control means to provide a recirculating arrangement to cyclically produce repetitive domain pairs having the same wall state as said third and fourth domains for usage in said utilization means.

* * * * *